(12) United States Patent
Kesler et al.

(10) Patent No.: US 12,334,713 B2
(45) Date of Patent: Jun. 17, 2025

(54) METHODS FOR FORMING A VERTICAL CAVITY SURFACE EMITTING LASER DEVICE

(71) Applicant: Lumentum Operations LLC, San Jose, CA (US)

(72) Inventors: Benjamin Kesler, Sunnyvale, CA (US); Ajit Vijay Barve, San Jose, CA (US); Jun Yang, Cupertino, CA (US); Guowei Zhao, Milpitas, CA (US); Matthew Glenn Peters, Menlo Park, CA (US)

(73) Assignee: Lumentum Operations LLC, San Jose, CA (US)

( * ) Notice: Subject to any disclaimer, the term of this patent is extended or adjusted under 35 U.S.C. 154(b) by 434 days.

(21) Appl. No.: 17/364,287

(22) Filed: Jun. 30, 2021

(65) Prior Publication Data

US 2022/0209506 A1  Jun. 30, 2022

Related U.S. Application Data

(60) Provisional application No. 63/132,222, filed on Dec. 30, 2020.

(51) Int. Cl.
*H01S 5/183* (2006.01)
*H01S 5/30* (2006.01)
(Continued)

(52) U.S. Cl.
CPC .......... *H01S 5/343* (2013.01); *H01S 5/18311* (2013.01); *H01S 5/18325* (2013.01); *H01S 5/18361* (2013.01); *H01S 5/3095* (2013.01); *H01S 5/3416* (2013.01); *H01S 2304/02* (2013.01); *H01S 2304/04* (2013.01)

(58) Field of Classification Search
CPC .......................... H01S 5/3095; H01S 5/18311
See application file for complete search history.

(56) References Cited

U.S. PATENT DOCUMENTS

2004/0028092 A1   2/2004  Kim
2005/0040413 A1*  2/2005  Takahashi ............. B82Y 20/00
                                                      257/96
(Continued)

FOREIGN PATENT DOCUMENTS

TW          201008064 A    2/2010

*Primary Examiner* — Minsun O Harvey
*Assistant Examiner* — Stephen Sutton Kotter
(74) *Attorney, Agent, or Firm* — Harrity & Harrity, LLP (57) ABSTRACT

A method of forming a VCSEL device cavity using a multiphase growth sequence includes forming a first mirror over a substrate, forming a tunnel junction over the first mirror, forming an oxidation aperture (OA) layer over the tunnel junction, forming a p-doped layer over the OA layer, forming an active region over the p-doped layer, forming a second mirror over the active region, and forming a contact layer over the second mirror. The first mirror, the tunnel junction, the OA layer, and the p-doped layer are formed using a metal-organic chemical vapor deposition (MOCVD) process during an MOCVD phase of the multiphase growth sequence. The active region, the second mirror, and the contact layer are formed using a molecular beam epitaxy (MBE) process during an MBE phase of the multiphase growth sequence.

20 Claims, 6 Drawing Sheets

(51) Int. Cl.
*H01S 5/34* (2006.01)
*H01S 5/343* (2006.01)

(56) References Cited

U.S. PATENT DOCUMENTS

| | | | |
|---|---|---|---|
| 2007/0002917 A1* | 1/2007 | Deng | H01S 5/18302 |
| | | | 372/50.1 |
| 2011/0037825 A1 | 2/2011 | Jikutani et al. | |
| 2017/0033534 A1 | 2/2017 | Chung et al. | |
| 2018/0241177 A1* | 8/2018 | Wong | H01S 5/3095 |
| 2020/0244043 A1* | 7/2020 | Kawashima | H01S 5/34333 |
| 2020/0321754 A1* | 10/2020 | Hegblom | H01S 5/3095 |
| 2020/0403376 A1* | 12/2020 | Weichmann | H01S 5/0421 |

* cited by examiner

METHODS FOR FORMING A VERTICAL CAVITY SURFACE EMITTING LASER DEVICE

RELATED APPLICATION

This application claims priority to U.S. Provisional Patent Application No. 63/132,222, entitled "OPTIMIZING GROWTH SEQUENCE AND PERFORMANCE OF DILUTE NITRIDE BASED VCSEL IN HYBRID GROWTH SEQUENCE," filed on Dec. 30, 2020, the content of which is incorporated by reference herein in its entirety.

TECHNICAL FIELD

The present disclosure relates generally to a vertical cavity surface emitting laser (VCSEL) and to methods for forming a VCSEL device.

BACKGROUND

A vertical-emitting laser device, such as a VCSEL, is a laser in which a beam is emitted in a direction perpendicular to a surface of a substrate (e.g., vertically from a surface of a semiconductor wafer). Multiple vertical-emitting devices may be arranged in an array with a common substrate.

SUMMARY

In some implementations, a method of forming a VCSEL device using a multiphase growth sequence includes forming a first mirror over a substrate; forming a tunnel junction over the first mirror; forming an oxidation aperture (OA) layer over the tunnel junction; forming a p-doped layer over the OA layer; forming an active region over the p-doped layer; forming a second mirror over the active region; and forming a contact layer over the second mirror, wherein: the first mirror, the tunnel junction, the OA layer, and the p-doped layer are formed using a metal-organic chemical vapor deposition (MOCVD) process during an MOCVD phase of the multiphase growth sequence; and the active region, the second mirror, and the contact layer are formed using a molecular beam epitaxy (MBE) process during an MBE phase of the multiphase growth sequence.

In some implementations, a method of forming a VCSEL device using a multiphase growth sequence includes forming a tunnel junction over a first mirror; forming an OA layer and a p-doped layer over the tunnel junction; and forming an active region over the OA layer and the p-doped layer, wherein: the tunnel junction, the OA layer, and the p-doped layer are formed using an MOCVD process during an MOCVD phase of the multiphase growth sequence; and the active region is formed using an MBE process during an MBE phase of the multiphase growth sequence.

In some implementations, a method of forming a VCSEL device using a multiphase growth sequence includes forming a first portion of an epitaxial structure using an MOCVD process during an MOCVD phase of the multiphase growth sequence; and forming a second portion of the epitaxial structure using an MBE process during an MBE phase of the multiphase growth sequence, wherein: the first portion of the epitaxial structure comprises a first mirror, a tunnel junction, an OA layer, and a p-doped layer, and the second portion of the epitaxial structure comprises an active region and a second mirror.

DETAILED DESCRIPTION

The following detailed description of example implementations refers to the accompanying drawings. The same reference numbers in different drawings may identify the same or similar elements.

A conventional laser device may be created by depositing different material layers on a substrate. For example, a single deposition process (e.g., a metal-organic chemical vapor deposition (MOCVD) process or a molecular beam epitaxy (MBE) process) may be used to form a set of reflectors and an active region on a substrate. Often, however, the deposition process may be suitable for forming some layers, such as reflectors, but not for others, such as an active region (or vice versa). In some cases, this creates low quality layers and/or structures within the conventional laser device, which introduces defects or allows defects to propagate through the conventional laser device. This can degrade a performance, manufacturability, and/or a reliability of the conventional laser device.

Some implementations described herein provide a multiphase growth sequence for forming a VCSEL. In some implementations, the multiphase growth sequence includes forming, on a substrate, a first set of layers and/or structures using a first MOCVD process during a first MOCVD phase and a second set of layers and/or structures using an MBE process during an MBE phase. The first set of layers and/or structures may include a first mirror, a tunnel junction, an oxidation aperture (OA) layer, and/or a p-doped layer. The second set of set of layers and/or structures may include an active region (e.g., a dilute nitride active region) and a second mirror.

In some implementations, the second set of layers and/or structures may include a contact layer, and the multiphase growth sequence includes forming a first metal layer on a surface of the substrate and a second metal layer on a surface of the contact layer. The first metal layer may be configured as an anode (e.g., an n-metal anode) for the VCSEL device, and the second metal layer may be configured as a cathode (e.g., an n-metal cathode) for the VCSEL device.

In some implementations, the first set of layers and/or structures may include a first contact layer, the second set of layers and/or structures may include a second contact layer and the multiphase growth sequence includes forming a metal layer on a surface of the second contact layer. The first contact layer may be configured as an anode (e.g., an n-contact anode) for the VCSEL device, and the metal layer may be configured as a cathode (e.g., an n-metal cathode) for the VCSEL device. In some implementations, the first set of layers and/or structures may further include a current blocking layer.

In this way, using a multiphase growth sequence enables formation of high-quality layers and/or structures within the VCSEL device. For example, an MOCVD process, which forms high quality mirrors (e.g., high quality distributed Bragg reflectors (DBRs)) and high quality tunnel junctions (e.g., that comprise highly doped semiconductor layers), is used during an MOCVD phase to form the first mirror and the tunnel junction. As another example, an MBE process, which forms high quality active regions (e.g., high quality active regions with dilute nitride quantum wells and/or indium gallium arsenide (InGaAs) quantum dot layers), is used during an MBE phase to form the active region. Accordingly, creation of high-quality layers and/or structures within the VCSEL device reduces a likelihood of defects or a propagation of defects through the VCSEL device. Therefore, using a multiphase growth sequence to form a VCSEL device improves a performance, manufacturability, and/or a reliability of the VCSEL device, as compared to a VCSEL device formed using a single deposition process.

Further, some implementations described herein enable formation of multiple VCSEL emitters in the VCSEL device. In some implementations, each VCSEL emitter may be configured to be driven independently (e.g., because each VCSEL emitter is associated with a separate n-metal cathode). Accordingly, each VCSEL emitter may be configured to independently emit light (e.g., at a same time or at a different time as another VCSEL emitter of the VCSEL device).

Figure 1A:
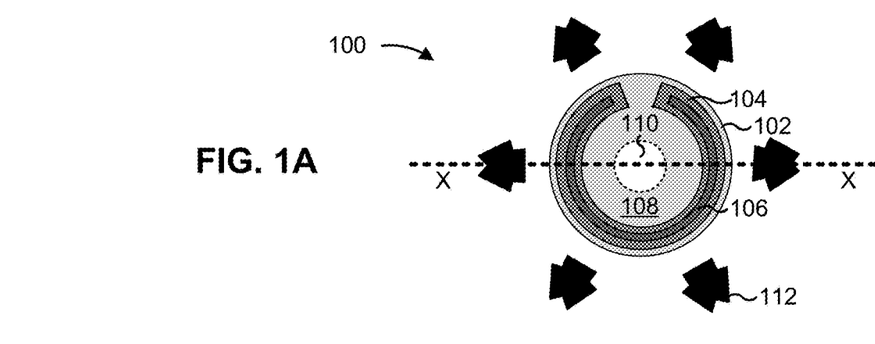
FIGS. 1A and 1B are diagrams depicting a top-view of an example emitter of a vertical cavity surface emitting laser (VCSEL) device and a cross-sectional view of the example emitter along the line X-X, respectively
Figure 1B:
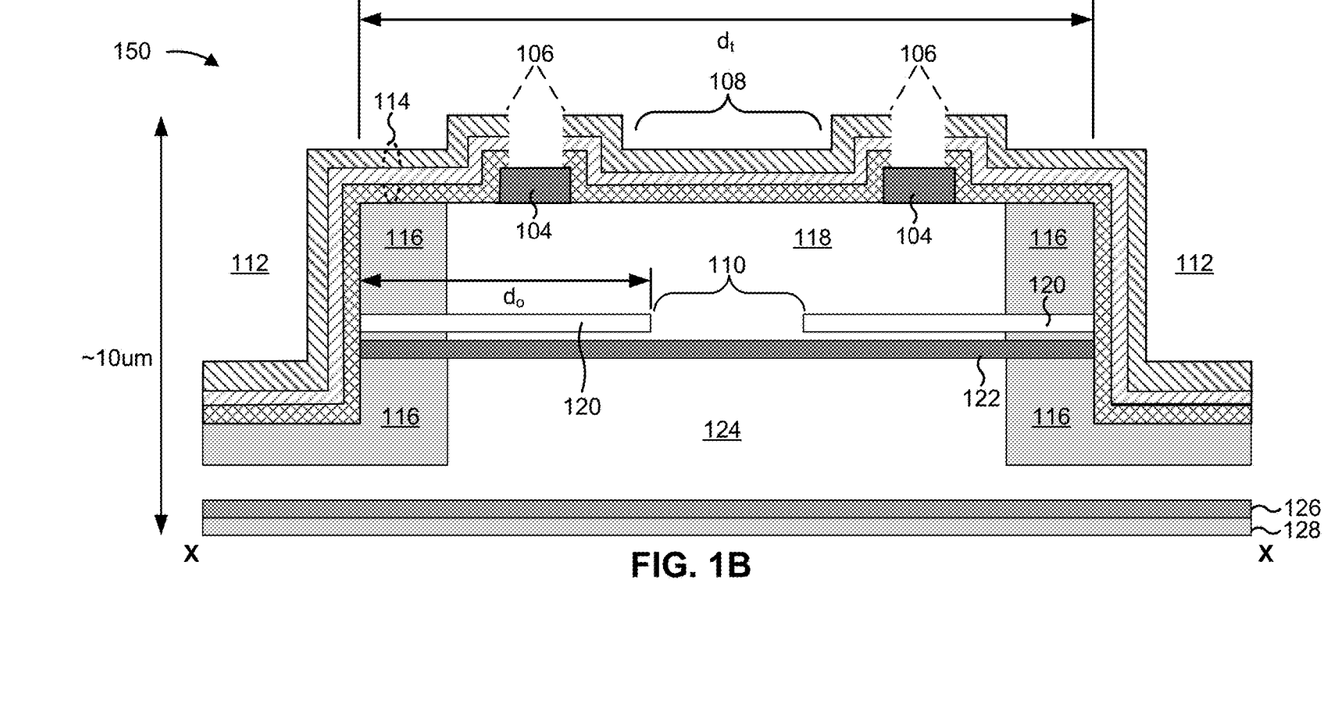

FIGS. 1A and 1B are diagrams depicting a top-view of an example emitter 100 of a VCSEL device and a cross-sectional view 150 of example emitter 100 along the line X-X, respectively. As shown in FIG. 1A, emitter 100 may include a set of emitter layers constructed in an emitter architecture.

As shown in FIG. 1A, emitter 100 may include an implant protection layer 102 that is circular in shape in this example. In some implementations, implant protection layer 102 may have another shape, such as an elliptical shape, a polygonal shape, or the like. Implant protection layer 102 is defined based on a space between sections of implant material (not shown) included in emitter 100.

As shown by the medium gray and dark gray areas in FIG. 1A, emitter 100 includes an ohmic metal layer 104 (e.g., a P-Ohmic metal layer or an N-Ohmic metal layer) that is constructed in a partial ring-shape (e.g., with an inner radius and an outer radius). The medium gray area shows an area of ohmic metal layer 104 covered by a protective layer (e.g. a dielectric layer, a passivation layer, and/or the like) of emitter 100 and the dark gray area shows an area of ohmic metal layer 104 exposed by via 106, described below. As shown, ohmic metal layer 104 overlaps with implant protection layer 102. Such a configuration may be used, for example, in the case of a P-up/top-emitting emitter 100. In the case of a bottom-emitting emitter 100, the configuration may be adjusted as needed.

Not shown in FIG. 1A, emitter 100 includes a protective layer in which via 106 is formed (e.g., etched). The dark gray area shows an area of ohmic metal layer 104 that is exposed by via 106 (e.g., the shape of the dark gray area may be a result of the shape of via 106) while the medium grey area shows an area of ohmic metal layer 104 that is covered by some protective layer. The protective layer may cover all of the emitter other than the vias. As shown, via 106 is formed in a partial ring-shape (e.g., similar to ohmic metal layer 104) and is formed over ohmic metal layer 104 such that metallization on the protection layer contacts ohmic metal layer 104. In some implementations, via 106 and/or ohmic metal layer 104 may be formed in another shape, such as a full ring-shape or a split ring-shape.

As further shown, emitter 100 includes an optical aperture 108 in a portion of emitter 100 within the inner radius of the partial ring-shape of ohmic metal layer 104. Emitter 100 emits a laser beam via optical aperture 108. As further shown, emitter 100 also includes a current confinement aperture 110 (e.g., an oxide aperture formed by an oxidation layer of emitter 100 (not shown)). Current confinement aperture 110 is formed below optical aperture 108.

As further shown in FIG. 1A, emitter 100 includes a set of trenches 112 (e.g., oxidation trenches) that are spaced (e.g., equally, unequally) around a circumference of implant protection layer 102. How closely trenches 112 can be positioned relative to the optical aperture 108 is dependent on the application, and is typically limited by implant protection layer 102, ohmic metal layer 104, via 106, and manufacturing tolerances.

The quantity and arrangement of layers shown in FIG. 1A are provided as an example. In practice, emitter 100 may include additional layers, fewer layers, different layers, or differently arranged layers than those shown in FIG. 1A. For example, while emitter 100 includes a set of six trenches 112, in practice, other configurations are possible, such as a compact emitter that includes five trenches 112, seven trenches 112, and/or the like. In some implementations, trench 112 may encircle emitter 100 to form a mesa structure $d_r$. As another example, while emitter 100 is a circular emitter design, in practice, other designs may be used, such as a rectangular emitter, a hexagonal emitter, an elliptical emitter, or the like. Additionally, or alternatively, a set of layers (e.g., one or more layers) of emitter 100 may perform one or more functions described as being performed by another set of layers of emitter 100, respectively.

Notably, while the design of emitter 100 is described as including a VCSEL, other implementations are possible. For example, the design of emitter 100 may apply in the context of another type of optical device, such as a light emitting diode (LED), or another type of vertical emitting (e.g., top emitting or bottom emitting) optical device. Additionally, the design of emitter 100 may apply to emitters of any wavelength, power level, emission profile, and/or the like. In other words, emitter 100 is not particular to an emitter with a given performance characteristic.

As shown in FIG. 1B, the example cross-sectional view may represent a cross-section of emitter 100 that passes through, or between, a pair of trenches 112 (e.g., as shown by the line labeled "X-X" in FIG. 1A). As shown, emitter 100 may include a backside anode layer 128, a substrate layer 126, a bottom mirror 124, an active region 122, an oxidation layer 120, a top mirror 118, an implant isolation material 116, a protective layer 114 (e.g. a dielectric passivation/mirror layer), and an ohmic metal layer 104. As shown, emitter 100 may have, for example, a total height that is approximately 10 μm.

Backside anode layer 128 may include a layer that makes electrical contact with substrate layer 126. For example, backside anode layer 128 may include an annealed metallization layer, such as an AuGeNi layer, a PdGeAu layer, or the like.

Substrate layer 126 may include a base substrate layer upon which epitaxial layers are grown. For example, substrate layer 126 may include a semiconductor layer, such as a such as a gallium arsenide (GaAs) layer, an indium phosphide (InP) layer, and/or the like.

Bottom mirror 124 may include a bottom reflector layer of emitter 100. For example, bottom mirror 124 may include a distributed Bragg reflector (DBR).

Active region 122 may include a layer that confines electrons and defines an emission wavelength of emitter 100. For example, active region 122 may be a quantum well.

Oxidation layer 120 may include an oxide layer that provides optical and electrical confinement of emitter 100. In some implementations, oxidation layer 120 may be formed as a result of wet oxidation of an epitaxial layer. For example, oxidation layer 120 may be an $Al_2O_3$ layer formed as a result of oxidation of an AlAs or AlGaAs layer. Trenches 112 may include openings that allow oxygen (e.g., dry oxygen, wet oxygen) to access the epitaxial layer from which oxidation layer 120 is formed.

Current confinement aperture 110 may include an optically active aperture defined by oxidation layer 120. A size of current confinement aperture 110 may range, for example, from approximately 4 μm to approximately 20 μm. In some implementations, a size of current confinement aperture 110 may depend on a distance between trenches 112 that surround emitter 100. For example, trenches 112 may be etched to expose the epitaxial layer from which oxidation layer 120 is formed. Here, before protective layer 114 is formed (e.g., deposited), oxidation of the epitaxial layer may occur for a particular distance (e.g., identified as $d_o$ in FIG. 1B) toward a center of emitter 100, thereby forming oxidation layer 120 and current confinement aperture 110. In some implementations, current confinement aperture 110 may include an oxide aperture. Additionally, or alternatively, current confinement aperture 110 may include an aperture associated with another type of current confinement technique, such as an etched mesa, a region without ion implantation, lithographically defined intra-cavity mesa and regrowth, or the like.

Top mirror 118 may include a top reflector layer of emitter 100. For example, top mirror 118 may include a DBR.

Implant isolation material 116 may include a material that provides electrical isolation. For example, implant isolation material 116 may include an ion implanted material, such as a hydrogen/proton implanted material or a similar implanted element to reduce conductivity. In some implementations, implant isolation material 116 may define implant protection layer 102.

Protective layer 114 may include a layer that acts as a protective passivation layer and which may act as an additional DBR. For example, protective layer 114 may include one or more sub-layers (e.g., a dielectric passivation layer and/or a mirror layer, a $SiO_2$ layer, a $Si_3N_4$ layer, an $Al_2O_3$ layer, or other layers) deposited (e.g., by chemical vapor deposition, atomic layer deposition, or other techniques) on one or more other layers of emitter 100.

As shown, protective layer 114 may include one or more vias 106 that provide electrical access to ohmic metal layer 104. For example, via 106 may be formed as an etched portion of protective layer 114 or a lifted-off section of protective layer 114. Optical aperture 108 may include a portion of protective layer 114 over current confinement aperture 110 through which light may be emitted.

Ohmic metal layer 104 may include a layer that makes electrical contact through which electrical current may flow. For example, ohmic metal layer 104 may include a Ti and Au layer, a Ti and Pt layer and/or an Au layer, or the like, through which electrical current may flow (e.g., through a bondpad (not shown) that contacts ohmic metal layer 104 through via 106). Ohmic metal layer 104 may be P-ohmic, N-ohmic, or other forms known in the art. Selection of a particular type of ohmic metal layer 104 may depend on the architecture of the emitters and is well within the knowledge of a person skilled in the art. Ohmic metal layer 104 may provide ohmic contact between a metal and a semiconductor and/or may provide a non-rectifying electrical junction and/or may provide a low-resistance contact. In some implementations, emitter 100 may be manufactured using a series of steps. For example, bottom mirror 124, active region 122, oxidation layer 120, and top mirror 118 may be epitaxially grown on substrate layer 126, after which ohmic metal layer 104 may be deposited on top mirror 118. Next, trenches 112 may be etched to expose oxidation layer 120 for oxidation. Implant isolation material 116 may be created via ion implantation, after which protective layer 114 may be deposited. Via 106 may be etched in protective layer 114 (e.g., to expose ohmic metal layer 104 for contact). Plating, seeding, and etching may be performed, after which substrate layer 126 may be thinned and/or lapped to a target thickness. Finally, backside anode layer 128 may be deposited on a bottom side of substrate layer 126.

The quantity, arrangement, thicknesses, order, symmetry, or the like, of layers shown in FIG. 1B is provided as an example. In practice, emitter 100 may include additional layers, fewer layers, different layers, differently constructed layers, or differently arranged layers than those shown in FIG. 1B. Additionally, or alternatively, a set of layers (e.g., one or more layers) of emitter 100 may perform one or more functions described as being performed by another set of layers of emitter 100 and any layer may comprise more than one layer.

Figure 2:
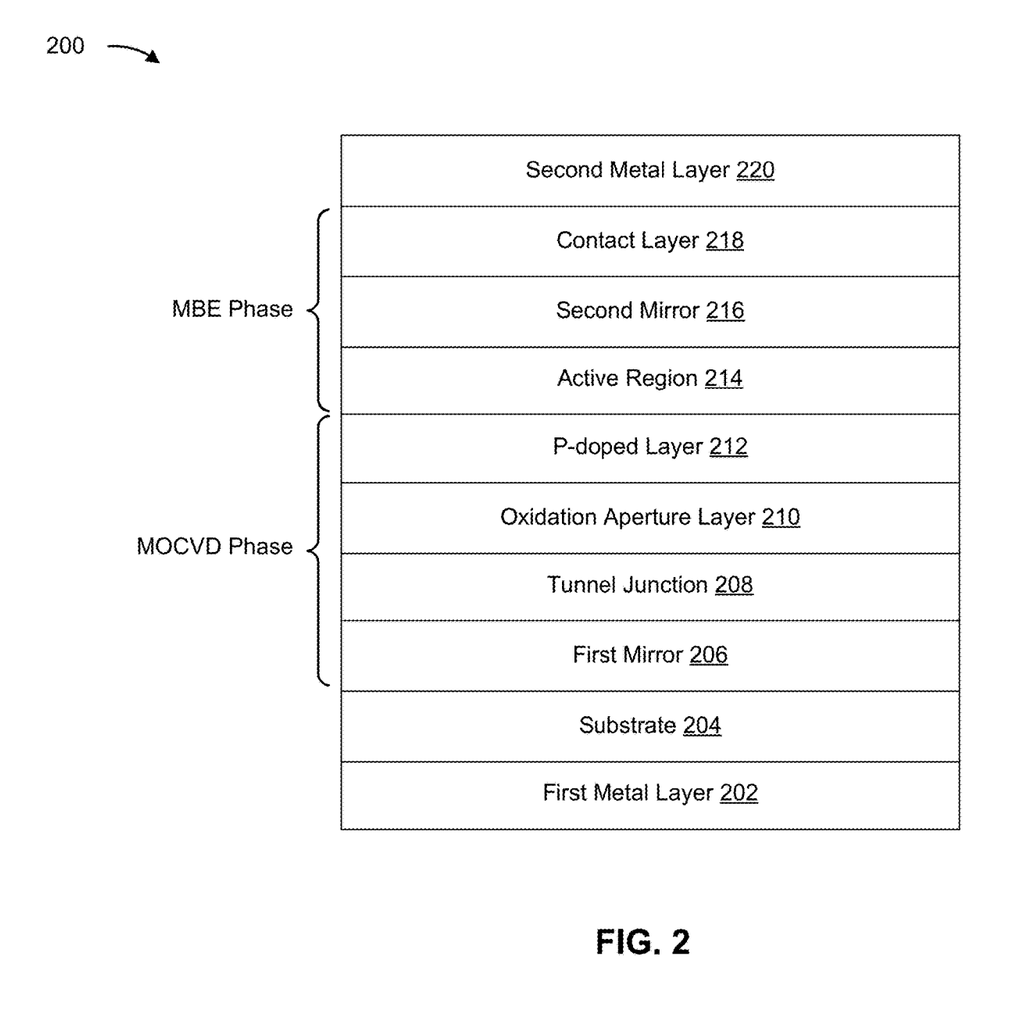
FIGS. 2-5 are diagrams of example VCSEL devices described herein.

FIG. 2 is a diagram of an example VCSEL device 200 described herein (e.g., that shows a layer configuration of the VCSEL device 200). The VCSEL device 200 may include, for example, a short-wave infrared (SWIR) VCSEL device, an oxide confined VCSEL device, an implant confined VCSEL device, a mesa confined VCSEL device, a top emitting VCSEL device, or a bottom emitting VCSEL device. In some implementations, the VCSEL device 200 may be configured to emit an output beam (e.g., an output laser beam). For example, the device may be configured to emit an output beam that has a wavelength in a near-infrared range (e.g., the wavelength of the output beam is in a range of 1200-1600 nanometers). As shown in FIG. 2, the VCSEL device 200 may include a first metal layer 202, a substrate 204, a first mirror 206, a tunnel junction 208, an OA layer 210, a p-doped layer 212, an active region 214, a second mirror 216, a contact layer 218, and/or a second metal layer 220 (e.g., that may be the same as, or similar to, corresponding structures and/or layers described herein in relation to FIGS. 1A-1B).

The first metal layer 202 may provide an electrical contact for the VCSEL device 200. The first metal layer comprises a metal layer, such as a gold (Au) layer, and/or a metal alloy layer, such as a gold-zinc (Au—Zn) layer, among other examples, through which electrical current may flow. In some implementations, the first metal layer 202 may be n-doped and may be configured as an anode (e.g., an n-metal anode) for the VCSEL device 200. The first metal layer 202 may be disposed over the substrate 204. For example, the first metal layer 202 may be disposed on (e.g., directly on) a surface of the substrate 204 (e.g., a bottom surface of the substrate 204).

The substrate 204 may include a substrate upon which other layers and/or structures shown in FIG. 2 are grown. The substrate 204 may include a semiconductor material, such as gallium arsenide (GaAs), indium phosphide (InP), germanium (Ge), and/or another type of semiconductor material. In some implementations, the substrate may be an n-doped substrate, such as an n-type GaAs substrate, an n-type InP substrate, or an n-type Ge substrate.

The first mirror 206 may be disposed over the substrate 204. For example, the first mirror 206 may be disposed on (e.g., directly on) a surface of the substrate 204 (e.g., a top surface of the substrate 204) or on one or more intervening layers or structures (e.g., one or more spacers, one or more cladding layers, and/or other examples) between the substrate 204 and the first mirror 206. The first mirror 206 may include a reflector, such as a dielectric DBR or a semiconductor DBR. For example, the first mirror 206 may include a set of alternating semiconductor layers, such as a set of alternating GaAs layers and aluminum gallium arsenide (AlGaAs) layers or a set of alternating AlGaAs layers with a low aluminum (Al) percentage and AlGaAs layers with a high Al percentage. In some implementations, the first mirror 206 may be an n-doped mirror (e.g., an n-doped DBR). For example, the first mirror 206 may include a set of alternating n-doped GaAs (n-GaAs) layers and n-doped AlGaAs (n-AlGaAs) layers or a set of alternating n-doped AlGaAs layers with a low Al percentage (low Al n-AlGaAs) and n-doped AlGaAs layers with a high Al percentage (high Al n-AlGaAs).

The tunnel junction 208 may be disposed over the first mirror 206. For example, the tunnel junction 208 may be disposed on (e.g., directly on) a surface of the first mirror 206 (e.g., a top surface of the first mirror 206) or on one or more intervening layers or structures (e.g., one or more spacers, one or more cladding layers, and/or other examples) between the first mirror 206 and the tunnel junction 208. The tunnel junction 208 may be configured to inject holes into the active region 214. In some implementations, the tunnel junction 208 may include a set of highly doped alternating semiconductor layers, such as a set of alternating highly n-doped semiconductor layers and highly p-doped semiconductor layers. For example, the tunnel junction 208 may include a set of alternating highly n-doped GaAs (n--GaAs) layers and highly p-doped AlGaAs (p+-AlGaAs) layers (or vice versa). At least one of the highly n-doped semiconductor layers may be doped with tellurium (Te), selenium (Se), and/or another n-type dopant. At least one of the highly p-doped semiconductor layers may be doped with Carbon (C) and/or another p-type dopant.

The OA layer 210 may be disposed over the tunnel junction 208. For example, the OA layer 210 may be disposed on (e.g., directly on) a surface of the tunnel junction 208 or on one or more intervening layers between the tunnel junction 208 and the OA layer 210. The OA layer 210 may include a group of layers associated with controlling one or more characteristics of the output beam emitted by the VCSEL device 200. For example, the OA layer 210 may include one or more layers to enhance a lateral confinement on carriers, to control an optical confinement of the output beam, and/or to perturb optical modes of the output beam (e.g., to affect a mode pattern in a desired manner). The one or more layers may include a set of alternating oxidized and non-oxidized layers, such as a set of alternating aluminum oxide (AlO) layers and GaAs layers.

The p-doped layer 212 may be disposed over the OA layer 210. For example, the p-doped layer 212 may be disposed on (e.g., directly on) a surface of the OA layer 210 or on one or more intervening layers (e.g., one or more spacers, one or more cladding layers, and/or other examples) between the OA layer 210 and the p-doped layer 212. The p-doped layer 212 may include at least one p-doped semiconductor layer, such as a p-doped GaAs (p-GaAs) layer or a p-doped AlGaAs (p-AlGaAs) layer. In some implementations, the p-doped layer 212 may be configured as a mirror (e.g., a third mirror). Accordingly, the p-doped layer 212 may include a p-doped reflector, such as a p-doped DBR. For example, the p-doped layer 212 may include a set of alternating p-doped GaAs (p-GaAs) layers and p-doped AlGaAs (p-AlGaAs) layers or a set of alternating p-doped AlGaAs layers with a low Al percentage (low Al p-AlGaAs) and p-doped AlGaAs layers with a high Al percentage (high Al p-AlGaAs).

The active region 214 may be disposed over the p-doped layer 212. For example, the active region 214 may be disposed on (e.g., directly on) a surface of the p-doped layer 212 or on one or more intervening layers (e.g., one or more spacers, one or more cladding layers, and/or other examples) between the p-doped layer 212 and the active region 214. The active region 214 may include one or more layers where electrons and holes recombine to emit light (e.g., as an output beam) and define an emission wavelength range of the VCSEL device 200. For example, the active region 214 may include one or more quantum wells, such as at least one dilute nitride quantum well (e.g., a gallium indium nitride arsenide (GaInNAs) quantum well and/or a gallium indium nitride arsenide antimonide (GaInNAsSb) quantum well), and/or one or more quantum dot layers, such as at least one indium gallium arsenide (InGaAs) quantum dot layer.

The second mirror 216 may be disposed over the active region 214. For example, the second mirror 216 may be disposed on (e.g., directly on) a surface of the active region 214 or on one or more intervening layers (e.g., one or more spacers, one or more cladding layers, and/or other examples) between the active region 214 and the second mirror 216. The second mirror 216 may include a reflector, such as a dielectric DBR or a semiconductor DBR. For example, the second mirror 216 may include a set of alternating semiconductor layers, such as a set of alternating GaAs layers and AlGaAs layers or a set of alternating AlGaAs layers with a low Al percentage and AlGaAs layers with a high Al percentage. In some implementations, the second mirror 216 may be an n-doped mirror (e.g., a n-doped DBR). For example, the second mirror 216 may include a set of alternating n-doped GaAs (p-GaAs) layers and n-doped AlGaAs (n-AlGaAs) layers or a set of alternating n-doped AlGaAs layers with a low Al percentage (low Al n-AlGaAs) and n-doped AlGaAs layers with a high Al percentage (high Al n-AlGaAs).

The contact layer 218 may be disposed over the second mirror 216. For example, the contact layer 218 may be disposed on (e.g., directly on) a surface of the second mirror 216 or on one or more intervening layers (e.g., one or more spacers, one or more cladding layers, and/or other examples) between the second mirror 216 and the contact layer 218. In some implementations, the contact layer 218 may be an n-doped layer and may facilitate an electrical connection with the second metal layer 220. For example, the contact layer 218 may include at least one n-doped semiconductor layer, such as an n-doped GaAs (n-GaAs) layer or an n-doped AlGaAs (n-AlGaAs) layer.

The second metal layer 220 may be disposed over the contact layer 218. For example, the second metal layer 220 may be disposed on (e.g., directly on) a surface of the contact layer 218 or on one or more intervening layers (e.g., one or more spacers, one or more cladding layers, and/or other examples) between the contact layer 218 and the second metal layer 220. The second metal layer 220 may provide an electrical contact for the VCSEL device 200. The second metal layer 220 may comprise a metal layer, such as an Au layer, and/or a metal alloy layer, such as an Au—Zn layer, among other examples, through which electrical current may flow. In some implementations, the second metal layer 220 may be n-doped and may be configured as a cathode (e.g., an n-metal cathode) for the VCSEL device 200.

While FIG. 2 shows the p-doped layer 212 disposed over the OA layer 210, in some implementations the respective positions of the p-doped layer 212 and the OA layer 210 may be switched. For example, the p-doped layer 212 may be disposed over the tunnel junction 208, the OA layer 210 may be disposed over the p-doped layer 212, and the active region 214 may be disposed over the OA layer 210. Additionally, or alternatively, there may be multiple p-doped layers 212. For example, a first p-doped layer 212 may be disposed over the tunnel junction 208, the OA layer 210 may be disposed over the first p-dope layer 212, and a second p-doped layer 212 may be disposed over the OA layer 210.

In some implementations, the VCSEL device 200 may be formed using a multiphase growth sequence, as described herein. For example, as shown in FIG. 2, the first mirror 206, the tunnel junction 208, the OA layer 210, and the p-doped layer 212 may be formed using an MOCVD process (also referred to as a metal-organic vapor phase epitaxy (MOVPE) process) during an MOCVD phase of the multiphase growth sequence, and the active region 214, the second mirror 216, and the contact layer 218 may be formed using an MBE process (e.g., that utilizes nitrogen gas (N2)) during an MBE phase of the multiphase growth sequence (e.g., where the MOCVD phase occurs before the MBE phase). The first metal layer 202 and/or the second metal layer using an additional formation process after the other layers and/or structures of the VCSEL device 200 are formed. Further details relating to the multiphase growth sequence are described herein in relation to FIG. 6.

As indicated above, FIG. 2 is provided as an example. Other examples may differ from what is described with regard to FIG. 2. In practice, the VCSEL device 200 may include additional layers and/or elements, fewer layers and/or elements, different layers and/or elements, or differently arranged layers and/or elements than those shown in FIG. 2. Further, structures and layers shown in FIG. 2 are respectively shown as continuously formed over other structures and layers and having a uniform thickness. In practice, the structures and layers may be non-continuously formed over other structures and layers and/or may have non-uniform thicknesses (e.g., in a similar manner as that shown in FIGS. 1A-1B and 5).

Figure 3:
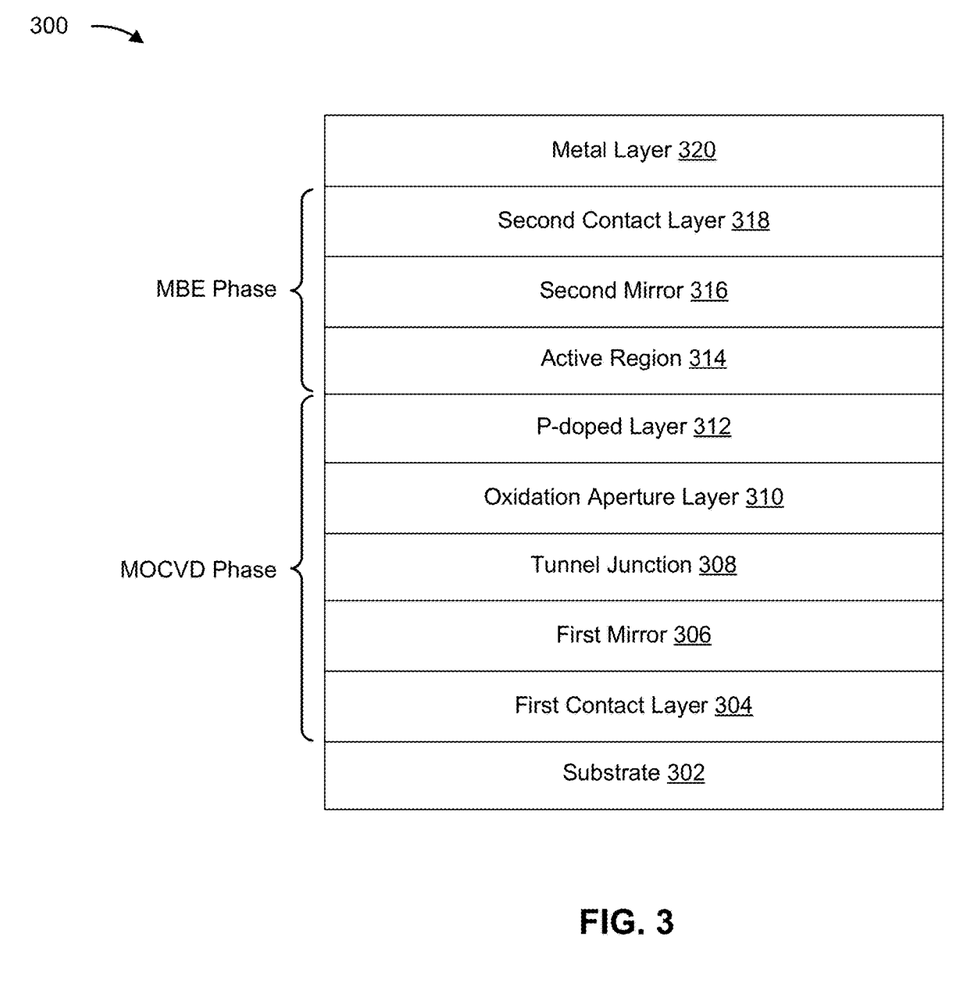

FIG. 3 is a diagram of an example VCSEL device 300 described herein (e.g., that shows a layer configuration of the VCSEL device 300). The VCSEL device 300 may include, for example, a SWIR VCSEL device, an oxide confined VCSEL device, an implant confined VCSEL device, a mesa confined VCSEL device, a top emitting VCSEL device, or a bottom emitting VCSEL device. In some implementations, the VCSEL device 300 may be configured to emit an output beam (e.g., an output laser beam). For example, the device may be configured to emit an output beam that has a wavelength in a near-infrared range (e.g., the wavelength of the output beam is in a range of 1200-1600 nanometers). As shown in FIG. 3, the VCSEL device 300 may include a substrate 302, a first contact layer 304, a first mirror 306, a tunnel junction 308, an OA layer 310, a p-doped layer 312, an active region 314, a second mirror 316, a second contact layer 318, and/or a metal layer 320 (e.g., that may be the same as, or similar to, corresponding structures and/or layers described herein in relation to FIGS. 1A-1B).

The substrate 302 may include a substrate upon which other layers and/or structures shown in FIG. 3 are grown. The substrate 302 may be the same as, or similar to, the substrate 204 described in relation to FIG. 2. For example, the substrate 302 may include a semiconductor material, such as GaAs, InP, Ge, and/or another type of semiconductor material. In some implementations, the substrate may be a semi-insulating substrate, such as a silicon (Si) substrate.

The first contact layer 304 may be disposed over the substrate 302. For example, the first contact layer 304 may be disposed on (e.g., directly on) a surface of the substrate 302 or on one or more intervening layers (e.g., one or more spacers, one or more cladding layers, and/or other examples) between the substrate 302 and the first contact layer 304. In some implementations, the first contact layer 304 may be included as a layer within the first mirror 306 (e.g., disposed between layers of the first mirror 306). In some implementations, the first contact layer 304 may be n-doped and may be configured as an anode (e.g., an n-contact anode) for the VCSEL device 300. For example, the first contact layer 304 may include at least one n-doped semiconductor layer, such as an n-doped GaAs (n-GaAs) layer or an n-doped AlGaAs (n-AlGaAs) layer. In some implementations, the first contact layer 304 may contact a metal layer (e.g., not shown in FIG. 3, but that is similar to the first metal layer 202 described herein in relation to FIG. 2) that is configured as an anode (e.g., an n-metal anode) for the VCSEL device 300. One or more other layers of the VCSEL device 300 may be etched, or otherwise removed, to allow the first contact layer 304 to contact the metal layer.

The first mirror 306 may be disposed over the first contact layer 304. For example, the first mirror 306 may be disposed on (e.g., directly on) a surface of the first contact layer 304 (e.g., a top surface of the first contact layer 304) or on one or more intervening layers or structures (e.g., one or more spacers, one or more cladding layers, and/or other examples) between the first contact layer 304 and the first mirror 306. The first mirror 306 may be the same as, or similar to, the first mirror 206 described in relation to FIG. 2. For example, the first mirror 306 may include a reflector, such as a dielectric DBR mirror that includes a set of alternating dielectric layers or a semiconductor DBR that includes a set of alternating GaAs layers and AlGaAs layers. In some implementations, the first mirror 306 may be an n-doped mirror (e.g., an n-doped DBR). For example, the first mirror 306 may include a set of alternating n-doped GaAs (n-GaAs) layers and n-doped AlGaAs (n-AlGaAs) layers or a set of alternating n-doped AlGaAs layers with a low Al percentage (low Al n-AlGaAs) and n-doped AlGaAs layers with a high Al percentage (high Al n-AlGaAs).

The tunnel junction 308 may be disposed over the first mirror 306. For example, the tunnel junction 308 may be disposed on (e.g., directly on) a surface of the first mirror 306 (e.g., a top surface of the first mirror 306) or on one or more intervening layers or structures (e.g., one or more spacers, one or more cladding layers, and/or other examples) between the first mirror 306 and the tunnel junction 308. The tunnel junction 308 may be the same as, or similar to, the tunnel junction 208 described in relation to FIG. 2 and may include a set of highly doped alternating semiconductor layers, such as a set of alternating highly n-doped semiconductor layers and highly p-doped semiconductor layers. For example, the tunnel junction 308 may include a set of alternating highly n-doped GaAs (n--GaAs) layers and highly p-doped AlGaAs (p+-AlGaAs) layers (or vice versa).

The OA layer 310 may be disposed over the tunnel junction 308. For example, the OA layer 310 may be disposed on (e.g., directly on) a surface of the tunnel junction 308 or on one or more intervening layers between the tunnel junction 308 and the OA layer 310. The OA layer 310 may be the same as, or similar to, the OA layer 210 described in relation to FIG. 2. For example, the OA layer 310 may include a set of alternating oxidized and non-oxidized layers, such as a set of alternating AlO and GaAs layers.

The p-doped layer 312 may be disposed over the OA layer 310. For example, the p-doped layer 312 may be disposed on (e.g., directly on) a surface of the OA layer 310 or on one or more intervening layers (e.g., one or more spacers, one or more cladding layers, and/or other examples) between the OA layer 310 and the p-doped layer 312. The p-doped layer 312 may be the same as, or similar to, the p-doped layer 212 described in relation to FIG. 2. For example, the p-doped layer 312 may include at least one p-doped semiconductor layer, such as a p-doped GaAs (p-GaAs) layer or a p-doped AlGaAs (p-AlGaAs) layer, or may include a p-doped reflector, such as a p-doped DBR that includes a set of alternating p-doped GaAs (p-GaAs) layers and p-doped AlGaAs (p-AlGaAs) layers or a set of alternating p-doped AlGaAs layers with a low Al percentage (low Al p-AlGaAs) and p-doped AlGaAs layers with a high Al percentage (high Al p-AlGaAs).

The active region 314 may be disposed over p-doped layer 312. For example, the active region 314 may be disposed on (e.g., directly on) a surface of p-doped layer 312 or on one or more intervening layers (e.g., one or more spacers, one or more cladding layers, and/or other examples) between p-doped layer 312 and the active region 314. The active region 314 may be the same as, or similar to, the active region 214 described in relation to FIG. 2. For example, the active region 314 may include one or more quantum wells, such as at least one dilute nitride quantum well (e.g., a GaInNAs quantum well and/or a GaInNAsSb quantum well), and/or one or more quantum dot layers, such as at least one InGaAs or InAs quantum dot layer.

The second mirror 316 may be disposed over the active region 314. For example, the second mirror 316 may be disposed on (e.g., directly on) a surface of the active region 314 or on one or more intervening layers (e.g., one or more spacers, one or more cladding layers, and/or other examples) between the active region 314 and the second mirror 316. The second mirror 316 may be the same as, or similar to, the second mirror 216 described in relation to FIG. 2. For example, the second mirror 316 may include a reflector, such as a dielectric DBR mirror that includes a set of alternating dielectric layers or a semiconductor DBR that includes a set of alternating GaAs layers and AlGaAs layers. In some implementations, the second mirror 316 may be an n-doped DBR. For example, the second mirror 316 may include a set of alternating n-doped GaAs (n-GaAs) layers and n-doped AlGaAs (n-AlGaAs) layers or a set of alternating n-doped AlGaAs layers with a low Al percentage (low Al n-AlGaAs) and n-doped AlGaAs layers with a high Al percentage (high Al n-AlGaAs).

The second contact layer 318 may be disposed over the second mirror 316. For example, the second contact layer 318 may be disposed on (e.g., directly on) a surface of the second mirror 316 or on one or more intervening layers (e.g., one or more spacers, one or more cladding layers, and/or other examples) between the second mirror 316 and the second contact layer 318. The second contact layer 318 may be the same as, or similar to, the contact layer 218 described in relation to FIG. 2. For example, the second contact layer 318 may include at least one n-doped semiconductor layer, such as an n-doped GaAs (n-GaAs) layer or an n-doped AlGaAs (n-AlGaAs) layer.

The metal layer 320 may be disposed over the second contact layer 318. For example, the metal layer 320 may be disposed on (e.g., directly on) a surface of the second contact layer 318 or on one or more intervening layers (e.g., one or more spacers, one or more cladding layers, and/or other examples) between the second contact layer 318 and the metal layer 320. The metal layer 320 may be the same as, or similar to, the second metal layer 220 described in relation to FIG. 2. For example, the metal layer 320 may comprise a metal layer, such as an Au layer, and/or a metal alloy layer, such as an Au—Zn layer, among other examples, through which electrical current may flow. In some implementations, the metal layer 320 may be n-doped and may be configured as a cathode (e.g., an n-metal cathode) for the VCSEL device 300.

While FIG. 3 shows the p-doped layer 312 disposed over the OA layer 310, in some implementations the respective positions of the p-doped layer 312 and the OA layer 310 may be switched. For example, the p-doped layer 312 may be disposed over the tunnel junction 308, the OA layer 310 may be disposed over the p-doped layer 312, and the active region 314 may be disposed over the OA layer 310. Additionally, or alternatively, there may be multiple p-doped layers 312. For example, a first p-doped layer 312 may be disposed over the tunnel junction 308, the OA layer 310 may be disposed over the first p-doped layer 312, and a second p-doped layer 312 may be disposed over the OA layer 310.

In some implementations, the VCSEL device 300 may be formed using a multiphase growth sequence, as described herein. For example, as shown in FIG. 3, the first contact layer 304, the first mirror 306, the tunnel junction 308, the OA layer 310, and the p-doped layer 312 may be formed using an MOCVD process during an MOCVD phase of the multiphase growth sequence, and the active region 314, the second mirror 316, and the second contact layer 318 may be formed using an MBE process (e.g., that utilizes nitrogen gas (N2)) during an MBE phase of the multiphase growth sequence (e.g., where the MOCVD phase occurs before the MBE phase). The metal layer 320 may be formed using an additional formation process after the other layers and/or structures of the VCSEL device 300 are formed. Additionally, or alternatively, one or more layers and/or structures of the VCSEL device 300 may be etched and the additional formation process may be used to form a metal layer on the first contact layer 304. Further details relating to the multiphase growth sequence are described herein in relation to FIG. 6.

As indicated above, FIG. 3 is provided as an example. Other examples may differ from what is described with regard to FIG. 3. In practice, the VCSEL device 300 may include additional layers and/or elements, fewer layers and/or elements, different layers and/or elements, or differently arranged layers and/or elements than those shown in FIG. 3. Further, structures and layers shown in FIG. 3 are respectively shown as continuously formed over other structures and layers and having a uniform thickness. In practice, the structures and layers may be non-continuously formed over other structures and layers and/or may have non-uniform thicknesses (e.g., in a similar manner as that shown in FIGS. 1A-1B and 5).

Figure 4:
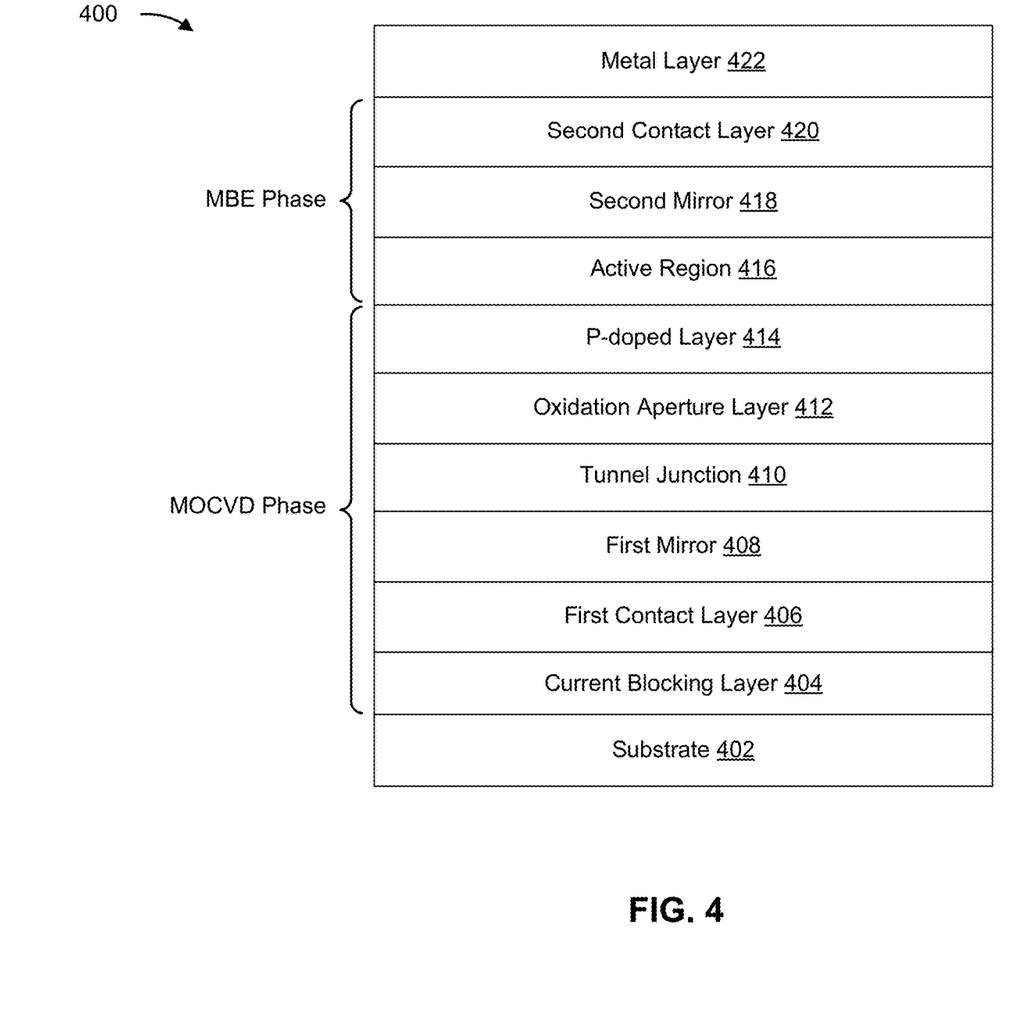

FIG. 4 is a diagram of an example VCSEL device 400 described herein (e.g., that shows a layer configuration of the VCSEL device 400). The VCSEL device 400 may include, for example, a SWIR VCSEL device, an oxide confined VCSEL device, an implant confined VCSEL device, a mesa confined VCSEL device, a top emitting VCSEL device, or a bottom emitting VCSEL device. In some implementations, the VCSEL device 400 may be configured to emit an output beam (e.g., an output laser beam). For example, the device may be configured to emit an output beam that has a wavelength in a near-infrared range (e.g., the wavelength of the output beam is in a range of 1200-1600 nanometers). As shown in FIG. 4, the VCSEL device 400 may include a substrate 402, a current blocking layer 404, a first contact layer 406, a first mirror 408, a tunnel junction 410, an OA layer 412, a p-doped layer 414, an active region 416, a second mirror 418, a second contact layer 420, and/or a metal layer 422 (e.g., that may be the same as, or similar to, corresponding structures and/or layers described herein in relation to FIGS. 1A-1B).

The substrate 402 may include a substrate upon which other layers and/or structures shown in FIG. 4 are grown. The substrate 402 may be the same as, or similar to, the substrate 204 described in relation to FIG. 2 and/or the substrate 302 described herein in relation to FIG. 3. For example, the substrate 402 may include a semiconductor material, such as GaAs, InP, Ge, and/or another type of semiconductor material. In some implementations, the substrate may be an n-doped substrate, such as an n-type GaAs substrate, an n-type InP substrate, or an n-type Ge substrate.

The current blocking layer 404 may be disposed over the substrate 402. For example, the current blocking layer 404 may be disposed on (e.g., directly on) a surface of the substrate 402 or on one or more intervening layers (e.g., one or more spacers, one or more cladding layers, and/or other examples) between the substrate 402 and the current blocking layer 404. The current blocking layer 404 may provide electrical isolation for the substrate 402. In some implementations, the current blocking layer 404 may comprise a non-conductive material, such as a polymer, a polyamide, and/or another type of dielectric material.

The first contact layer 406 may be disposed over the current blocking layer 404. For example, the first contact layer 406 may be disposed on (e.g., directly on) a surface of the current blocking layer 404 or on one or more intervening layers (e.g., one or more spacers, one or more cladding layers, and/or other examples) between the current blocking layer 404 and the first contact layer 406. The first contact layer 406 may be the same as, or similar to, the first contact layer 304 described in relation to FIG. 3. In some implementations, the first contact layer 406 may be included as a layer within the first mirror 408 (e.g., disposed between layers of the first mirror 408). In some implementations, the first contact layer 406 may be n-doped and may be configured as an anode (e.g., an n-contact anode) for the VCSEL device 400. For example, the first contact layer 406 may include at least one n-doped semiconductor layer, such as an n-doped GaAs (n-GaAs) layer or an n-doped AlGaAs (n-AlGaAs) layer. In some implementations, the first contact layer 406 may contact a metal layer (e.g., not shown in FIG. 4, but that is similar to the first metal layer 202 described herein in relation to FIG. 2) that is configured as an anode (e.g., an n-metal anode) for the VCSEL device 400. One or more other layers of the VCSEL device 400 may be etched, or otherwise removed, to allow the first contact layer 406 to contact the metal layer.

The first mirror 408 may be disposed over the first contact layer 406. For example, the first mirror 408 may be disposed on (e.g., directly on) a surface of the first contact layer 406 (e.g., a top surface of the first contact layer 406) or on one or more intervening layers or structures (e.g., one or more spacers, one or more cladding layers, and/or other examples) between the first contact layer 406 and the first mirror 408. The first mirror 408 may be the same as, or similar to, the first mirror 206 described in relation to FIG. 2 and/or the first mirror 306 described herein in relation to FIG. 3. For example, the first mirror 408 may include a reflector, such as a dielectric DBR mirror that includes a set of alternating dielectric layers or a semiconductor DBR that includes a set of alternating GaAs layers and AlGaAs layers. In some implementations, the first mirror 408 may be an n-doped mirror (e.g., an n-doped DBR). For example, the first mirror 408 may include a set of alternating n-doped GaAs (n-GaAs) layers and n-doped AlGaAs (n-AlGaAs) layers or a set of alternating n-doped AlGaAs layers with a low Al percentage (low Al n-AlGaAs) and n-doped AlGaAs layers with a high Al percentage (high Al n-AlGaAs).

The tunnel junction 410 may be disposed over the first mirror 408. For example, the tunnel junction 410 may be disposed on (e.g., directly on) a surface of the first mirror 408 (e.g., a top surface of the first mirror 408) or on one or more intervening layers or structures (e.g., one or more spacers, one or more cladding layers, and/or other examples) between the first mirror 408 and the tunnel junction 410. The tunnel junction 410 may be the same as, or similar to, the tunnel junction 208 described in relation to FIG. 2 and/or the tunnel junction 308 described herein in relation to FIG. 3. The tunnel junction 410 may include a set of highly doped alternating semiconductor layers, such as a set of alternating highly n-doped semiconductor layers and highly p-doped semiconductor layers. For example, the tunnel junction 410 may include a set of alternating highly n-doped GaAs (n--GaAs) layers and highly p-doped AlGaAs (p+-AlGaAs) layers (or vice versa).

The OA layer 412 may be disposed over the tunnel junction 410. For example, the OA layer 412 may be disposed on (e.g., directly on) a surface of the tunnel junction 410 or on one or more intervening layers between the tunnel junction 410 and the OA layer 412. The OA layer 412 may be the same as, or similar to, the OA layer 210 described in relation to FIG. 2 and/or the OA layer 310 described herein in relation to FIG. 3. For example, the OA layer 412 may include a set of alternating oxidized and non-oxidized layers, such as a set of alternating AlO and GaAs layers.

The p-doped layer 414 may be disposed over the OA layer 412. For example, the p-doped layer 414 may be disposed on (e.g., directly on) a surface of the OA layer 412 or on one or more intervening layers (e.g., one or more spacers, one or more cladding layers, and/or other examples) between the OA layer 412 and the p-doped layer 414. The p-doped layer 414 may be the same as, or similar to, the p-doped layer 212 described in relation to FIG. 2 and/or the p-doped layer 312 described herein in relation to FIG. 3. For example, the p-doped layer 414 may include at least one p-doped semiconductor layer, such as a p-doped GaAs (p-GaAs) layer or a p-doped AlGaAs (p-AlGaAs) layer, or may include a p-doped reflector, such as a p-doped DBR that includes a set of alternating p-doped GaAs (p-GaAs) layers and p-doped AlGaAs (p-AlGaAs) layers or a set of alternating p-doped AlGaAs layers with a low Al percentage (low Al p-AlGaAs) and p-doped AlGaAs layers with a high Al percentage (high Al p-AlGaAs).

The active region 416 may be disposed over p-doped layer 414. For example, the active region 416 may be disposed on (e.g., directly on) a surface of p-doped layer 414 or on one or more intervening layers (e.g., one or more spacers, one or more cladding layers, and/or other examples) between p-doped layer 414 and the active region 416. The active region 416 may be the same as, or similar to, the active region 214 described in relation to FIG. 2 and/or the active region 314 described herein in relation to FIG. 3. For example, the active region 416 may include one or more quantum wells, such as at least one dilute nitride quantum well (e.g., a GaInNAs quantum well and/or a GaInNAsSb quantum well), and/or one or more quantum dot layers, such as at least one InGaAs or InAs quantum dot layer.

The second mirror 418 may be disposed over the active region 416. For example, the second mirror 418 may be disposed on (e.g., directly on) a surface of the active region 416 or on one or more intervening layers (e.g., one or more spacers, one or more cladding layers, and/or other examples) between the active region 416 and the second mirror 418. The second mirror 418 may be the same as, or similar to, the second mirror 216 described in relation to FIG. 2 and/or the second mirror 316 described herein in relation to FIG. 3. For example, the second mirror 418 may include a reflector, such as a dielectric DBR mirror that includes a set of alternating dielectric layers or a semiconductor DBR that includes a set of alternating GaAs layers and AlGaAs layers. In some implementations, the second mirror 418 may be an n-doped DBR. For example, the second mirror 418 may include a set of alternating n-doped GaAs (n-GaAs) layers and n-doped AlGaAs (n-AlGaAs) layers or a set of alternating n-doped AlGaAs layers with a low Al percentage (low Al n-AlGaAs) and n-doped AlGaAs layers with a high Al percentage (high Al n-AlGaAs).

The second contact layer 420 may be disposed over the second mirror 418. For example, the second contact layer 420 may be disposed on (e.g., directly on) a surface of the second mirror 418 or on one or more intervening layers (e.g., one or more spacers, one or more cladding layers, and/or other examples) between the second mirror 418 and the second contact layer 420. The second contact layer 420 may be the same as, or similar to, the contact layer 218 described in relation to FIG. 2 and/or the second contact layer 318 described herein in relation to FIG. 3. For example, the second contact layer 420 may include at least one n-doped semiconductor layer, such as an n-doped GaAs (n-GaAs) layer or an n-doped AlGaAs (n-AlGaAs) layer.

The metal layer 422 may be disposed over the second contact layer 420. For example, the metal layer 422 may be disposed on (e.g., directly on) a surface of the second contact layer 420 or on one or more intervening layers (e.g., one or more spacers, one or more cladding layers, and/or other examples) between the second contact layer 420 and the metal layer 422. The metal layer 422 may be the same as, or similar to, the second metal layer 220 described in relation to FIG. 2 and/or the metal layer 320 described herein in relation to FIG. 3. For example, the metal layer 422 may comprise a metal layer, such as an Au layer, and/or a metal alloy layer, such as an Au—Zn layer, among other examples, through which electrical current may flow. In some implementations, the metal layer 422 may be n-doped and may be configured as a cathode (e.g., an n-metal cathode) for the VCSEL device 400.

While FIG. 4 shows the p-doped layer 414 disposed over the OA layer 412, in some implementations the respective positions of the p-doped layer 414 and the OA layer 412 may be switched. For example, the p-doped layer 414 may be disposed over the tunnel junction 410, the OA layer 412 may be disposed over the p-doped layer 414, and the active region 416 may be disposed over the OA layer 412. Additionally, or alternatively, there may be multiple p-doped layers 414. For example, a first p-doped layer 414 may be disposed over the tunnel junction 410, the OA layer 412 may be disposed over the first p-doped layer 414, and a second p-doped layer 414 may be disposed over the OA layer 412.

In some implementations, the VCSEL device 400 may be formed using a multiphase growth sequence, as described herein. For example, as shown in FIG. 4, the current blocking layer 404, the first contact layer 406, the first mirror 408, the tunnel junction 410, the OA layer 412, and the p-doped layer 414 may be formed using an MOCVD during an MOCVD phase of the multiphase growth sequence, and the active region 416, the second mirror 418, and the second contact layer 420 may be formed using an MBE process (e.g., that utilizes nitrogen gas (N2)) during an MBE phase of the multiphase growth sequence (e.g., where the MOCVD phase occurs before the MBE phase). The metal layer 422 may be formed using an additional formation process after the other layers and/or structures of the VCSEL device 400 are formed. Additionally, or alternatively, one or more layers and/or structures of the VCSEL device 400 may be etched and the additional formation process may be used to form a metal layer on the first contact layer 406. Further details relating to the multiphase growth sequence are described herein in relation to FIG. 6.

As indicated above, FIG. 4 is provided as an example. Other examples may differ from what is described with regard to FIG. 4. In practice, the VCSEL device 400 may include additional layers and/or elements, fewer layers and/or or elements, different layers and/or elements, or differently arranged layers and/or elements than those shown in FIG. 4. Further, structures and layers shown in FIG. 4 are respectively shown as continuously formed over other structures and layers and having a uniform thickness. In practice, the structures and layers may be non-continuously formed over other structures and layers and/or may have non-uniform thicknesses (e.g., in a similar manner as that shown in FIGS. 1A-1B and 5).

Figure 5:
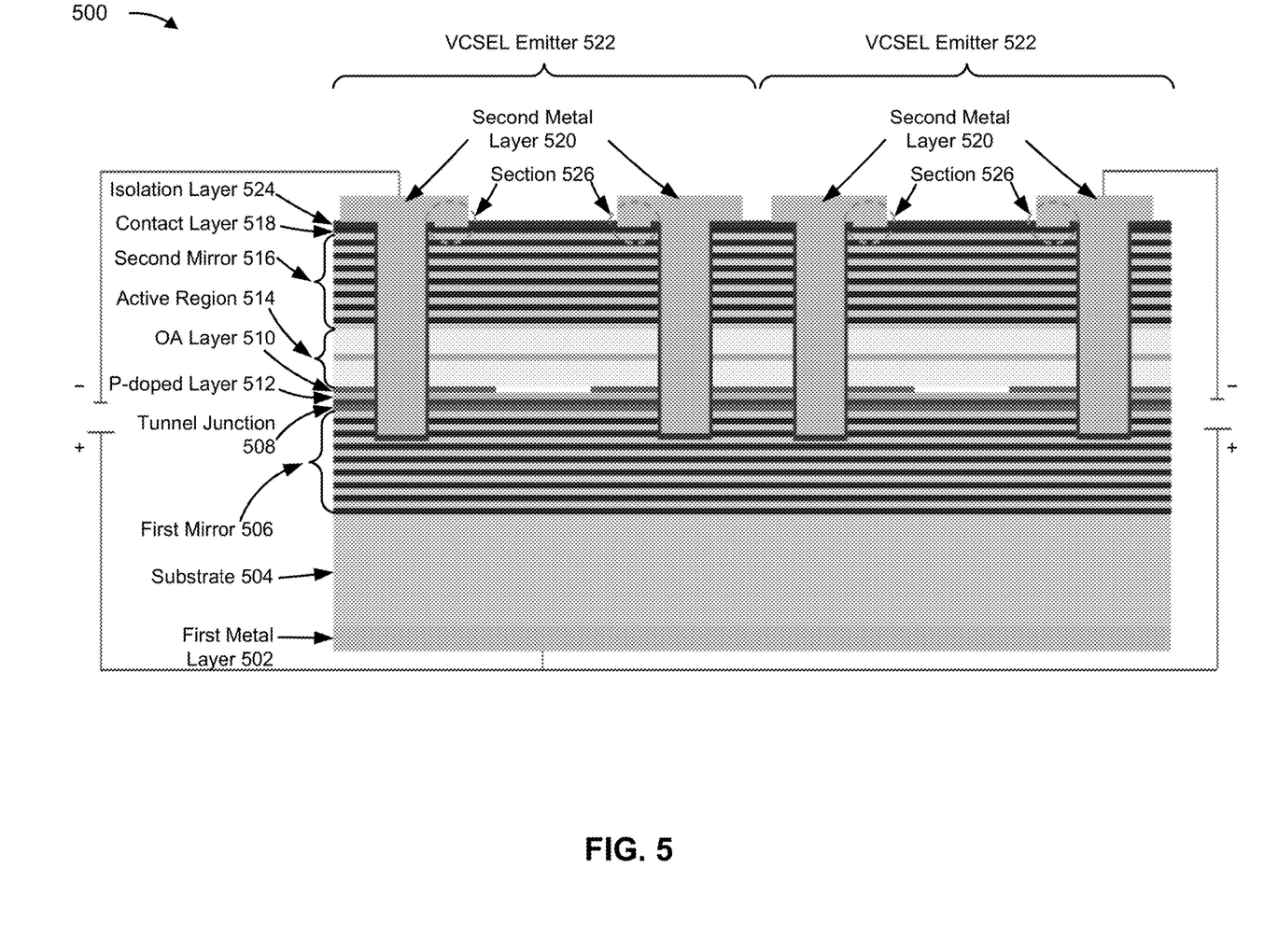

FIG. 5 is a diagram of an example VCSEL device 500 described herein. The VCSEL device 500 may be the same as, or similar to, the VCSEL device 200 described in relation to FIG. 2. For example, the VCSEL device 500 may include a first metal layer 502, a substrate 504, a first mirror 506, a tunnel junction 508, an OA layer 510, a p-doped layer 512, an active region 514, a second mirror 516, a contact layer 518, and/or a second metal layer 520 that are the same as, or similar to, corresponding layers and/or structures of the VCSEL device 200.

As further shown in FIG. 5, the VCSEL device 500 may include multiple VCSEL emitters 522 (e.g., that are respectively the same as, or similar to, the emitter 100 described herein in relation to FIG. 1). The multiple VCSEL emitters 522 may share the first metal layer 502 and the substrate 504, but each VCSEL emitter 522 may be defined by further processing of the other layers and/or structures formed on the VCSEL device 500. For example, as shown in FIG. 5, each VCSEL emitter may be defined by a pair of vias (e.g., that are etched using a chemical etching process), wherein each via is coated with an isolation layer 524 and the second metal layer 520 (e.g., such that a portion of the second metal layer 520 fills the via and a portion of the second metal layer 520 is disposed on a top surface of the VCSEL device 500. The isolation layer 524 may provide electrical isolation for the second metal layer 520 and may comprise a non-conductive material, such as a polymer, a polyamide, and/or another type of dielectric material. As further shown in FIG. 5, for each via, a section 526 may be removed from the isolation layer 524 to cause a portion of the second metal layer 520 associated with the via to contact the contact layer 518. This allows electrical current to flow between the second metal layer 520 (e.g., that is configured as n-metal cathode) and the first metal layer 502 (e.g., that is configured as an n-metal anode), which may cause the VCSEL emitter 522 to emit light (e.g., as an output beam). For example, the VCSEL emitter 522 may be configured to emit an output beam that has a wavelength in a near-infrared range (e.g., the wavelength of the output beam is in a range of 1200-1600 nanometers).

In the configuration shown in FIG. 5, each VCSEL emitter 522 may be independently driven (e.g., by the individual portions of the second metal layer 520 associated with each VCSEL emitter 522). Accordingly, for the two VCSEL emitters 522 shown in FIG. 5 and at a particular moment in time, both VCSEL emitters 522 may emit light, both VCSEL emitters 522 may not emit light, or one VCSEL emitter 522 may emit light and the other VCSEL emitter 522 may not emit light.

As indicated above, FIG. 5 is provided as an example. Other examples may differ from what is described with regard to FIG. 5. In practice, the VCSEL device 500 may include additional layers and/or elements, fewer layers and/or elements, different layers and/or elements, or differently arranged layers and/or elements than those shown in FIG. 5.

Figure 6:
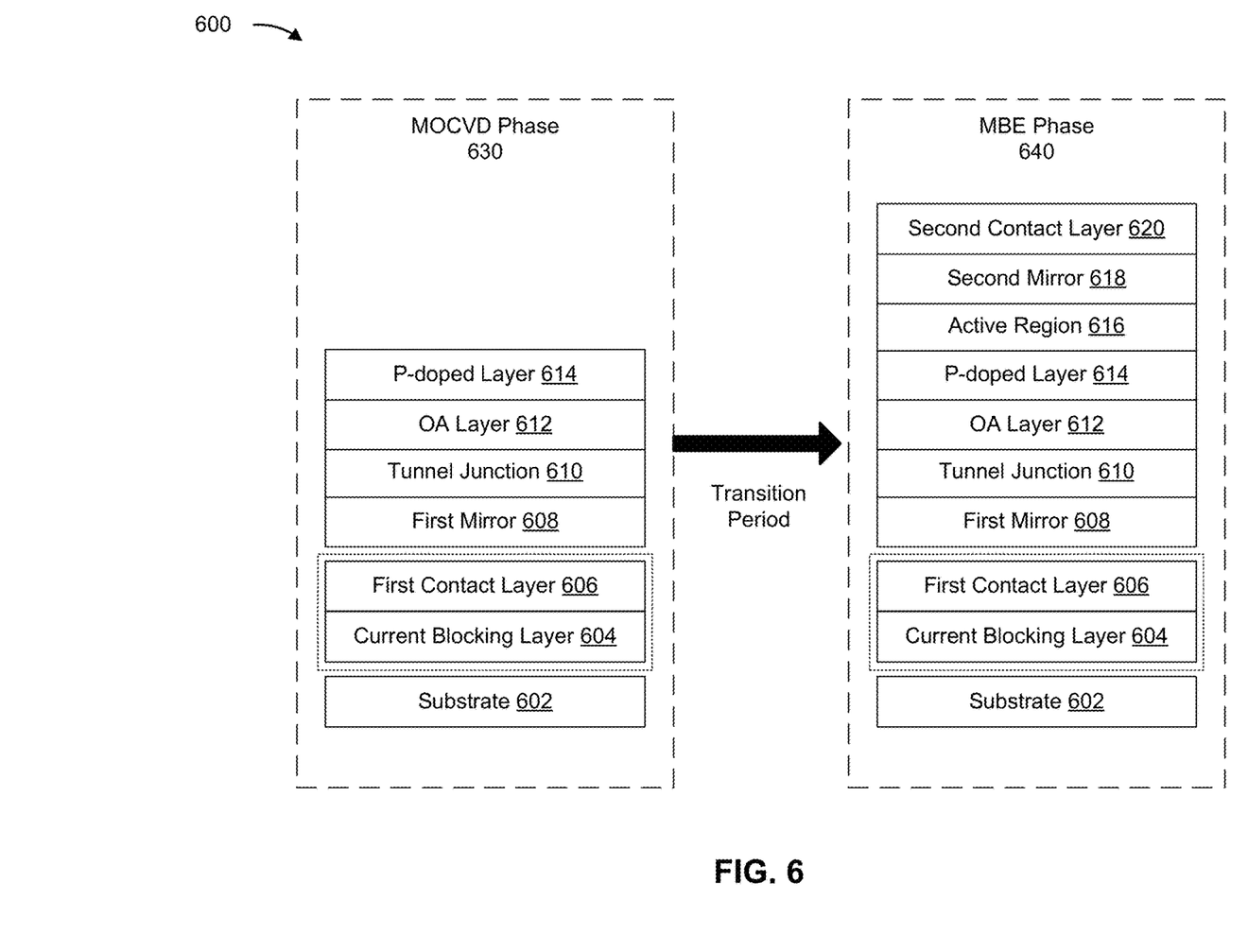
FIG. 6 is a diagram of an example implementation of a multiphase growth sequence for forming a VCSEL device described herein.

FIG. 6 is a diagram of an example implementation 600 of a multiphase growth sequence for forming a VCSEL device (e.g., a VCSEL device that is the same as, or similar to, the VCSEL devices 200, 300, 400, and/or 500 described in relation to FIGS. 2-5). As shown in FIG. 6, the VCSEL device may be formed by forming a substrate 602, a current blocking layer 604, a first contact layer 606, a first mirror 608, a tunnel junction 610, an OA layer 612, a p-doped layer 614, an active region 616, a second mirror 618, and/or a second contact layer 620. The substrate 602, the current blocking layer 604, the first contact layer 606, the first mirror 608, the tunnel junction 610, the OA layer 612, the p-doped layer 614, the active region 616, the second mirror 618, and/or the second contact layer 620 may be the same as, or similar to, corresponding structures and/or layers described herein in relation to FIGS. 1A-1B and 2-5.

As shown in FIG. 6, the multiphase growth sequence may include an MOCVD phase 630. During the MOCVD phase 630, an MOCVD process may be used to form one or more layers of a first portion of an epitaxial structure (e.g., that will become the VCSEL device). For example, as shown in FIG. 6, the MOCVD process may be used to form the first mirror 608 over the substrate 602, the tunnel junction 610 over the first mirror 608, the OA layer 612 over the tunnel junction 610, and/or the p-doped layer 614 over the OA layer 612. In some implementations, the MOCVD process may be used to form the first mirror 608 over the substrate 602, the tunnel junction 610 over the first mirror 608, the p-doped layer 614 over the tunnel junction 610, and/or the OA layer 612 over the p-doped layer 614.

As indicated by the dotted line box, the current blocking layer 604 and/or the first contact layer 606 are optional and may be formed for particular epitaxial structure configurations (e.g., as shown in FIGS. 3-4). For example, the MOCVD process may be used to form the current blocking layer 604 over the substrate 602, the first contact layer 606 over the current blocking layer 604, and the first mirror 608 over the first contact layer 606. As another example, the MOCVD process may be used to form the first contact layer 606 over the substrate 602 and the first mirror 608 over the first contact layer 606. In both examples, the MOCVD process may be used to form the tunnel junction 610, the OA layer 612, and/or the p-doped layer 614 as described above. Additionally, or alternatively, the MOCVD process may be used to form the p-doped layer 614 before the OA layer 612. For example, the MOCVD process may be used to form the p-doped layer 614 over the tunnel junction 610 and the OA layer 612 over the p-doped layer 614.

As further shown in FIG. 6, after the MOCVD phase 630 has finished, the multiphase growth sequence may include a transition period (e.g., a time after the MOCVD phase 630 and before an MBE phase 640). For example, during the transition period, the first portion of the epitaxial structure formed by the MOCVD phase 630 may be physically moved from an MOCVD processing environment (e.g., that is used during the MOCVD phase 630) to an MBE processing environment (e.g., that is used during the MBE phase 640).

As further shown in FIG. 6, the multiphase growth sequence may include the MBE phase 640. During the MBE phase 640, an MBE process may be used to form one or more layers of a second portion of the epitaxial structure. For example, as shown in FIG. 6, the MBE process may be used to form the active region 616 over the p-doped layer 614, the second mirror 618 over the active region 616, and/or the second contact layer 620 over the second mirror 618. Accordingly, after the second MBE phase 640 has finished, the VCSEL device is formed (e.g., that includes the first portion of the epitaxial structure formed by the MOCVD phase 630 and/or the second portion of the epitaxial structure formed by the MBE phase 640).

In some implementations, an additional formation process (e.g., that includes an MBE process, an MOCVD process, or another formation process) may be used to form one or more metal layers on the VCSEL device (e.g., after the first portion of the epitaxial structure and the second portion of the epitaxial structure are formed). For example, the additional formation process may be used to form a first metal layer (not shown in FIG. 6) on a surface (e.g., a bottom surface) of the substrate 602 and/or a second metal layer (not shown in FIG. 6) on a surface (e.g., a top surface) of the second contact layer 620. In some implementations, the additional formation process may be used to etch, or otherwise remove, portions of the epitaxial structure to allow the first metal layer to be formed on the first contact layer 606. The first metal layer and/or the second metal layer may be the same as, or similar to, corresponding layers described herein in relation to FIGS. 1A-1B and 2-5.

As indicated above, FIG. 6 is provided as an example. Other examples may differ from what is described with regard to FIG. 6. In practice, the multiphase growth sequence may include forming additional layers and/or elements, fewer layers and/or elements, different layers and/or elements, or differently arranged layers and/or elements than those shown in FIG. 6.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "bottom," "above," "upper," "top," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A method of forming a bottom emitting vertical cavity surface emitting laser (VCSEL) device using a multiphase growth sequence, comprising:
    forming, using a metal-organic chemical vapor deposition (MOCVD) process in an MOCVD processing environment during an MOCVD phase of the multiphase growth sequence, an epitaxial structure comprising:
        a first n-doped distributed Bragg reflector (DBR) a first mirror over a substrate,
        a tunnel junction over the first doped DBR,
        an oxidation aperture (OA) layer over the tunnel junction, and
        a p-doped DBR over the OA layer;
    moving, during a transition period following the MOCVD phase, the epitaxial structure from the MOCVD processing environment to a molecular beam epitaxy (MBE) processing environment; and
    forming, using an MBE process in the MBE processing environment during an MBE phase of the multiphase growth sequence and after the transition period:
        an active region over the p-doped DBR,
        a second n-doped DBR over the active region, and
        a contact layer over the second doped DBR.

2. The method of claim 1, wherein the bottom emitting VCSEL device is configured to emit an output beam, wherein the output beam is associated with a wavelength range of 1200-1600 nanometers.

3. The method of claim 1, wherein the bottom emitting VCSEL device comprises at least one of:
    a near-infrared VCSEL device;
    an oxide confined VCSEL device;
    an implant confined VCSEL device; or
    a mesa confined VCSEL device.

4. The method of claim 1, wherein:
    the substrate is an n-doped substrate;
    the tunnel junction comprises an n-doped semiconductor layer and a p-doped semiconductor layer,
        wherein the n-doped semiconductor layer is doped with tellurium (Te) or selenium (Se), and
        wherein the p-doped semiconductor layer is doped with carbon (C); and
    the active region comprises at least one of a dilute nitride quantum well or an indium gallium arsenide (InGaAs) quantum dot layer.

5. The method of claim 1, further comprising:
    forming an additional contact layer over the substrate, wherein:
        the additional contact layer is formed using the MOCVD process during the MOCVD phase of the multiphase growth sequence, and
        forming the first n-doped DBR over the substrate comprises forming the first n-doped DBR over the additional contact layer.

6. The method of claim 1, further comprising:
    forming a current blocking layer over the substrate; and
    forming an additional contact layer over the current blocking layer, wherein:
        the current blocking layer and the additional contact layer are formed using the MOCVD process during the MOCVD phase of the multiphase growth sequence, and
        forming the first n-doped DBR over the substrate comprises forming the first n-doped DBR over the additional contact layer.

7. The method of claim 1, further comprising:
    forming a metal layer over the second n-doped DBR, wherein:
        the metal layer is formed after the MOCVD phase and after the MBE phase of the multiphase growth sequence.

8. The method of claim 7, further comprising:
    forming an additional metal layer on a surface of the substrate, wherein:
        the additional metal layer is formed after the MOCVD phase and after the MBE phase of the multiphase growth sequence.

9. The method of claim 8, wherein the metal layer is associated with a cathode of the bottom emitting VCSEL device and the additional metal layer is associated with an anode of the bottom emitting VCSEL device.

10. A method of forming a bottom emitting vertical cavity surface emitting laser (VCSEL) device using a multiphase growth sequence, comprising:
    forming, using a metal-organic chemical vapor deposition (MOCVD) process in an MOCVD processing environment during an MOCVD phase of the multiphase growth sequence, an epitaxial structure comprising:
        a first n-doped distributed Bragg reflector (DBR),
        a tunnel junction over the first n-doped DBR, and
        an oxidation aperture (OA) layer and a p-doped DBR over the tunnel junction;
    moving, during a transition period following the MOCVD phase, the epitaxial structure from the MOCVD processing environment to a molecular beam epitaxy (MBE) processing environment; and forming, using an MBE process in the MBE processing environment during an MBE phase of the multiphase growth sequence and after the transition period:
an active region over the OA layer and the p-doped DBR, and
a second n-doped DBR over the active region.

11. The method of claim 1, wherein the OA layer is formed directly on a surface of the tunnel junction.

12. The method of claim 10, wherein the active region comprises at least one of a dilute nitride quantum well or an indium gallium arsenide (InGaAs) quantum dot layer.

13. The method of claim 10, wherein the tunnel junction comprises an n-doped semiconductor layer and a p-doped semiconductor layer, wherein:
the n-doped semiconductor layer comprises gallium arsenide (GaAs) doped with tellurium (Te) or selenium (Se); and
the p-doped semiconductor layer comprises GaAs doped with carbon (C).

14. The method of claim 10, wherein the first n-doped DBR is formed over an n-doped substrate.

15. The method of claim 10, further comprising:
forming, using the MOCVD process during the MOCVD phase of the multiphase growth sequence:
a contact layer over a semi-insulating substrate, wherein:
the first n-doped DBR is formed over the contact layer, and
the contact layer is configured as an anode for the bottom emitting VCSEL device.

16. The method of claim 10, further comprising:
forming a current blocking layer over a n-doped substrate; and
forming a contact layer over the current blocking layer, wherein:
the first n-doped DBR is formed over the contact layer,
the current blocking layer and the contact layer are formed using the MOCVD process during the MOCVD phase of the multiphase growth sequence, the current blocking layer comprises a dielectric material, and
the contact layer is configured as an anode for the bottom emitting VCSEL device.

17. The method of claim 10, further comprising:
forming, using the MBE process during the MBE phase of the multiphase growth sequence:
a contact layer over the second n-doped DBR, and
a metal layer over the contact layer.

18. A method of forming a bottom emitting vertical cavity surface emitting laser (VCSEL) device using a multiphase growth sequence, comprising:
forming a first portion of an epitaxial structure using a metal-organic chemical vapor deposition (MOCVD) process in an MOCVD processing environment during an MOCVD phase of the multiphase growth sequence;
moving, during a transition period following the MOCVD phase, the epitaxial structure from the MOCVD processing environment to a molecular beam epitaxy (MBE) processing environment; and
forming a second portion of the epitaxial structure using an MBE process in the MBE processing environment during an MBE phase of the multiphase growth sequence and after the transition period, wherein:
the first portion of the epitaxial structure comprises a first n-doped distributed Bragg reflector (DBR), a tunnel junction, an oxidation aperture (OA) layer, and a p-doped layer, and
the second portion of the epitaxial structure comprises an active region and a second n-doped DBR.

19. The method of claim 18, wherein the active region comprises at least one of a dilute nitride quantum well or an indium gallium arsenide (InGaAs) quantum dot layer.

20. The method of claim 18, wherein:
the first portion of the epitaxial structure further comprises a first contact layer; and
the second portion of the epitaxial structure further comprises a second contact layer.

* * * * *